United States Patent [19]
Takahashi et al.

[11] Patent Number: 5,416,871
[45] Date of Patent: May 16, 1995

[54] MOLDED OPTICAL CONNECTOR MODULE

[75] Inventors: Hisato Takahashi; Yutaka Matsumura; Toru Kawagishi, all of Yokohama, Japan

[73] Assignee: Sumitomo Electric Industries, Ltd., Japan

[21] Appl. No.: 223,663

[22] Filed: Apr. 6, 1994

[30] Foreign Application Priority Data

Apr. 9, 1993 [JP] Japan .................. 5-083641

[51] Int. Cl.⁶ .............................. G02B 6/12
[52] U.S. Cl. ....................... 385/88; 385/14; 385/89; 385/92; 385/94
[58] Field of Search ............. 385/14, 15, 31, 49, 385/70, 73, 88, 89, 92, 94, 139

[56] References Cited

U.S. PATENT DOCUMENTS

| | | | |
|---|---|---|---|
| 4,911,519 | 3/1990 | Burton et al. | 385/14 |
| 4,930,857 | 6/1990 | Acarlar | 385/88 X |
| 5,039,194 | 8/1991 | Block et al. | 385/88 |
| 5,099,307 | 3/1992 | Go et al. | 385/88 X |
| 5,123,066 | 6/1992 | Acarlar | 385/14 |
| 5,127,071 | 6/1992 | Go | 385/73 |
| 5,170,453 | 12/1992 | Go et al. | 385/70 |
| 5,179,601 | 1/1993 | Gotoh et al. | 385/14 |
| 5,275,765 | 1/1994 | Go et al. | 264/1.5 |
| 5,276,754 | 1/1994 | Blair et al. | 385/88 |
| 5,304,818 | 4/1994 | Go | 257/81 |
| 5,325,454 | 6/1994 | Rittle et al. | 385/76 |
| 5,345,524 | 9/1994 | Lebby et al. | 385/88 |
| 5,353,364 | 10/1994 | Kurashima | 385/88 |
| 5,361,318 | 11/1994 | Go et al. | 385/89 |

*Primary Examiner*—Brian Healy
*Attorney, Agent, or Firm*—Beveridge, DeGrandi, Weilacher & Young

[57] ABSTRACT

An optical module comprises an optical connector at the receiver side and an optical connector at the transmitter side, and hybrid IC for the receiver side and the transmitter side are mounted on a lead frame. The lead frame comprises a projecting part projecting outside from a part where each semiconductor chip is mounted. Nearby the connection part between the optical connector and the hybrid IC, the projecting part is connected to a ground pattern on a surface of the hybrid IC by a bonding wire. The wire is placed at this location, so that the effect of noise caused by an atmospheric electric wave, or GND/power lines can be reduced.

41 Claims, 21 Drawing Sheets

MOLDED OPTICAL CONNECTOR MODULE

BACKGROUND OF THE INVENTION

1. Field of the Invention

The present invention relates to an optical module which is sealed by mold material.

2. Related Background Art

In recent years, packaging techniques for semiconductor integrated circuits have made great progress and various kinds of electronic parts are packaged with high density. Therefore, it is an important subject to reduce noises caused by the adjacent electronic parts. In general, a noise source is an atmospheric electric wave generated by the adjacent electronic parts, a noise of the power source through GND/power lines or others. In particular, countermeasure for the noises is important for an optical module which converts a feeble optical signal into an electric signal.

In the conventional optical modules, for certain electronic parts installed inside, a metal shielding board was installed or instead of the electronic parts, other circuit parts for reducing noise were mounted.

However, in such shielding structure in which the electronic parts were shielded, a shielding member larger than the electronic parts was installed, and in particular, in a case that shielding was required on a same substrate, a region occupied by the shielding member on the substrate was substantially large. This hindered the advance of miniaturizing a module.

For the electronic parts, an additional process of installing the shielding member was required, which caused both an increase of the number of processes of building the optical module and a fall of the productive efficiency.

Further, there was a practical problem that in the resin molding type products, the shielding member was broken by the stress when resin was poured.

SUMMARY OF THE INVENTION

It is an object of the present invention to provide an optical module which can reduce the effect of noise caused by an atmospheric electric wave or GND/power lines without reducing the mounting density of the circuit substrate which constitutes the optical module.

It is another object of the present invention to provide an optical module with a configuration which hardly receives the stress when the resin is poured.

It is another object of the present invention to provide an optical module at low cost and with good productivity.

The above and other objects will be apparent from the following description.

According to the present invention, an optical module sealed by mold material is provided. This optical module comprises a light receiving device for converting an optical signal into an electric signal, a first substrate comprising a circuit which is electrically connected to an output terminal of the light receiving device through a signal connecting wire, for processing an electric signal coming from the output terminal, a mounting substrate for mounting said first substrate, and a conductive wire placed nearby a connection part between the optical connector and the first substrate without contacting said signal connecting wire. The mounting substrate comprises a first reference potential region which is of a part of the mounting substrate, projecting outside from a part where the first substrate is mounted. The first substrate comprises a second reference potential region on a surface of the first substrate, which is electrically connected to the mounting substrate, and one end of the conductive wire is connected to one of the first reference potential region and the second reference potential region, and the other end of the conductive wire is connected to one of the first reference potential region and the second reference potential region.

Further, according to the present invention, an optical module sealed by mold material is provided. This optical module comprises a first optical connector comprising a light receiving device for converting an optical signal into an electric signal, a first substrate comprising a circuit which is electrically connected to an output terminal of the light receiving device through a first signal connecting wire, for processing an electric signal coming from the output terminal, a first mounting substrate for mounting the first substrate, a second optical connector comprising a light emitting device for converting an electric signal into an optical signal, a second substrate comprising a circuit which is electrically connected to an input terminal of the light emitting device through a second signal connecting wire, for applying an electric signal to the input terminal, a second mounting substrate for mounting the second substrate, electrically connected to the first mounting substrate, and a conductive wire is placed nearby a connection part between the first optical connector and the first substrate without contacting the first signal connecting wire. The first mounting substrate comprises a first reference potential region which is of a part of the first mounting substrate, projecting outside from a part where the first substrate is mounted, and the first substrate comprises a second reference potential region on a surface of the first substrate, which region is electrically connected to the first mounting substrate. One end of the conductive wire is connected to one of the first reference potential region and the second reference potential region, and the other end of the conductive wire is connected to one of the first reference potential region and the second reference potential region.

Moreover, according to the present invention, an optical module sealed by mold material is provided. This optical module comprises a first optical connector comprising a light receiving device for converting an optical signal into an electric signal, a first substrate comprising a circuit which is electrically connected to an output terminal of the light receiving device through a first signal connecting wire, for processing an electric signal coming from the output terminal, a first mounting substrate for mounting the first substrate, a second optical connector comprising a light emitting device for converting an electric signal into an optical signal, a second substrate comprising a circuit which is electrically connected to an input terminal of the light emitting device through a second signal connecting wire, for applying an electric signal to the input terminal, a second mounting substrate for mounting the second substrate electrically connected to the first mounting substrate, a first conductive wire placed nearby a connection part between the first optical connector and the first substrate without contacting the first signal connecting wire, and a second conductive wire placed nearby a connection part between the second optical connector and the second substrate without contacting the second signal connecting wire. The first mounting substrate comprises a first reference potential region which is of a part of the first mounting substrate, projecting outside from a part where the first substrate is mounted, and the first substrate comprises a second reference potential on a surface of the first substrate, which region is electrically connected to the first mounting substrate. One end of the first conductive wire is connected to one of the first reference potential region and the second reference potential region, and the other end of the first conductive wire is connected to one of the first reference potential region and the second reference potential region. The second mounting substrate comprises a third reference potential region which is of a part of the second mounting substrate, projecting outside from a part where the second substrate is mounted, and the second substrate comprises a fourth reference potential region on a surface of the second substrate, which region is electrically connected to the second mounting substrate. One end of the second conductive wire is connected to one of the third reference potential region and the fourth reference potential region, and the other end of the second conductive wire is connected to one of the third reference potential region and the fourth reference potential region.

Here, each conductive wire is preferably a bonding wire or a flat ribbon wire, and further a plurality of conductive wires may be provided.

Further, each mounting substrate is preferably constructed with a part of the lead frame.

Further, the potential applied to each reference potential region is preferably a ground potential.

DETAILED DESCRIPTION OF THE PREFERRED EMBODIMENTS

The preferred embodiments of the present invention which was used in the measurement, will be explained with reference to the accompanying drawings hereunder.

First Embodiment

Figure 1:
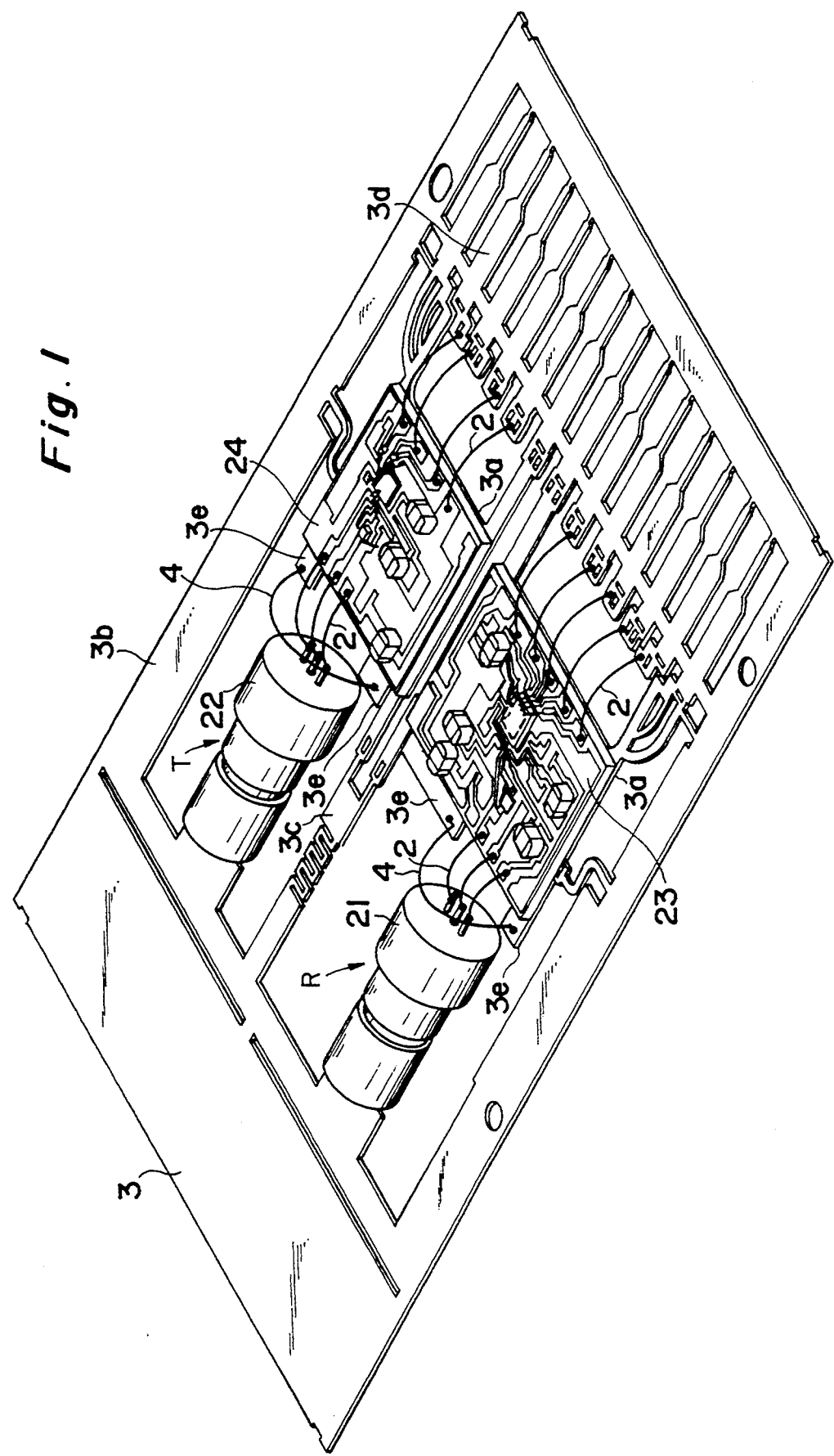
FIG. 1 is a perspective view showing an optical module (sub-module) before molding.

An optical module according to the present embodiment is shown in FIG. 1. The optical module shown in FIG. 1 is for a large-scale link and comprises an optical connector R comprising a light receiving device 21 and an optical connector T comprising a light emitting device 22. An output terminal of the light receiving device 21 is connected to a hybrid IC 23 comprising a circuit for processing an electric signal coming from the output terminal, through wires (signal connecting wires) 2. An input terminal of the light emitting device 22 is connected to a hybrid IC 24 comprising a circuit for controlling the light emission for applying electric signals to the input terminal, through the wires 2.

The optical connectors R and T, and the hybrid IC 23 and 24 are fixed at a conductive lead frame 3. The lead frame 3 comprises island parts 3a for mounting the hybrid ICs 23 and 24, a frame part 3b surrounding the parts 3a, a support part 3c in the center, lead pins 3d, and connection parts (reference potential regions) 3e. The connection parts 3e are formed, projecting from the both sides of the connection region between the optical connector R and the hybrid IC 23, and from the both sides of the connection region between the optical connector T and the semiconductor chip 24. Then, between the connection parts 3e, a conductive wire 4 made of a bonding wire is installed across the wires 2. The conductive wire 4 is made of a 150 μm diameter Al wire.

It was found that the noise level could be reduced to some extent, which will be described in detail, by placing the conductive wires 4 nearby the connection region as described above. This seems to be because the atmospheric electric wave generated by the adjacent electronic parts is shielded to some extent and because the GND strengthens.

Further, ground patterns (reference potential region) S on the surfaces of the hybrid ICs 23 and 24 are electrically connected with the island parts 3a of the lead frame 3 through a large number of through-holes. In a case that the GND potential is applied to the island part 3a, the GND potential is also applied to the ground pattern S. Accordingly, the conductive wire 4 as described above can be connected to the ground pattern S.

Further, certain electrode regions of the hybrid IC 23 and 24 are electrically connected with the lead pins 3d of the lead frame 3 through the wires 2.

Figure 2:
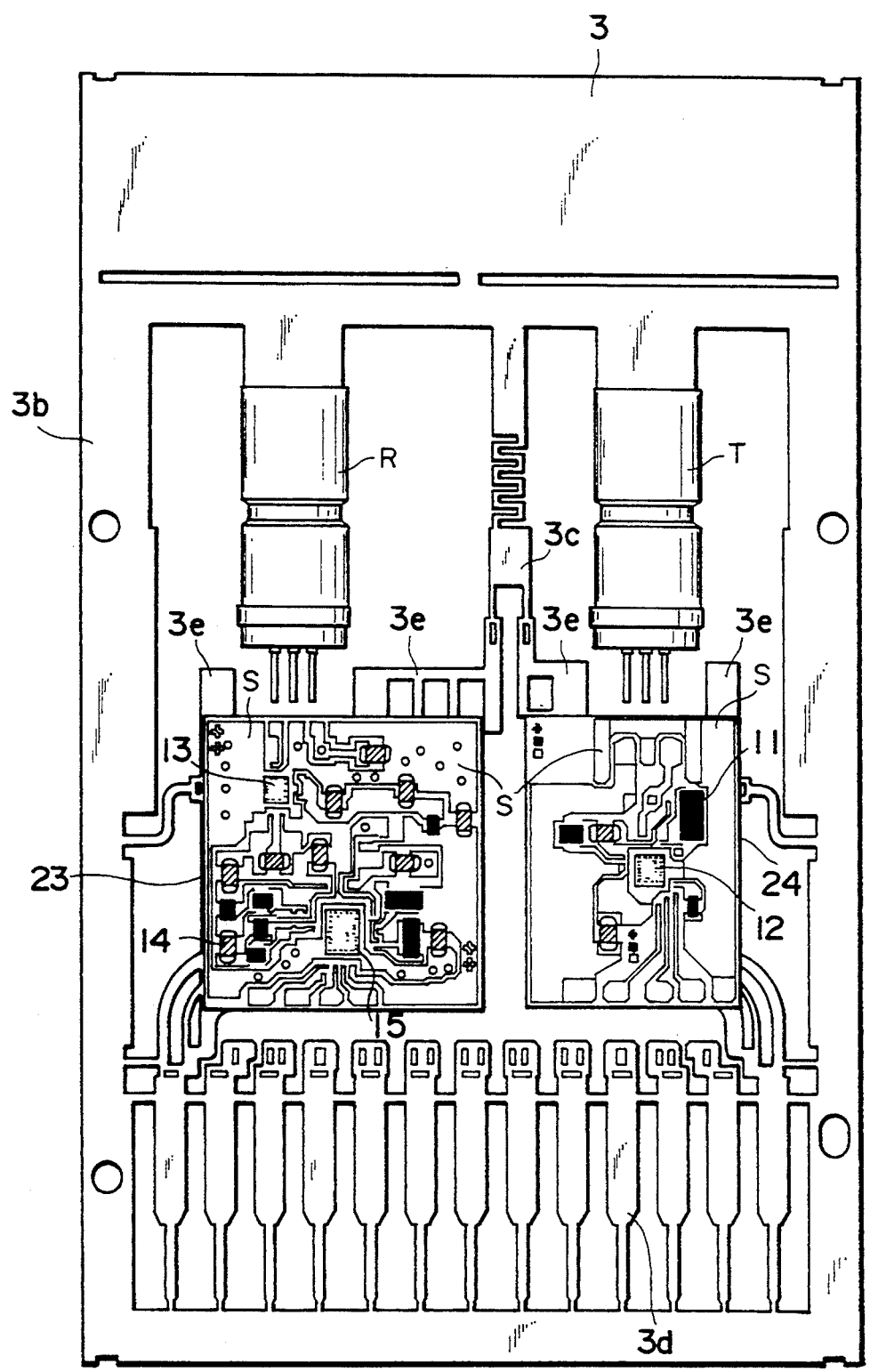
FIG. 2 is a plane view showing an optical module of FIG. 1.

The important circuit devices on the hybrid ICs 23 and 24 are shown in FIG. 2. It is convenient to omit wires for connection and others from FIG. 2 for explanation. In FIG. 2, reference numerals 11 and 12 represent a print resistor and a LED drive IC, respectively, and reference numerals 13, 14, and 15 represent a pre-amplifier IC, a condenser, and a comparator IC, respectively.

Figure 3:
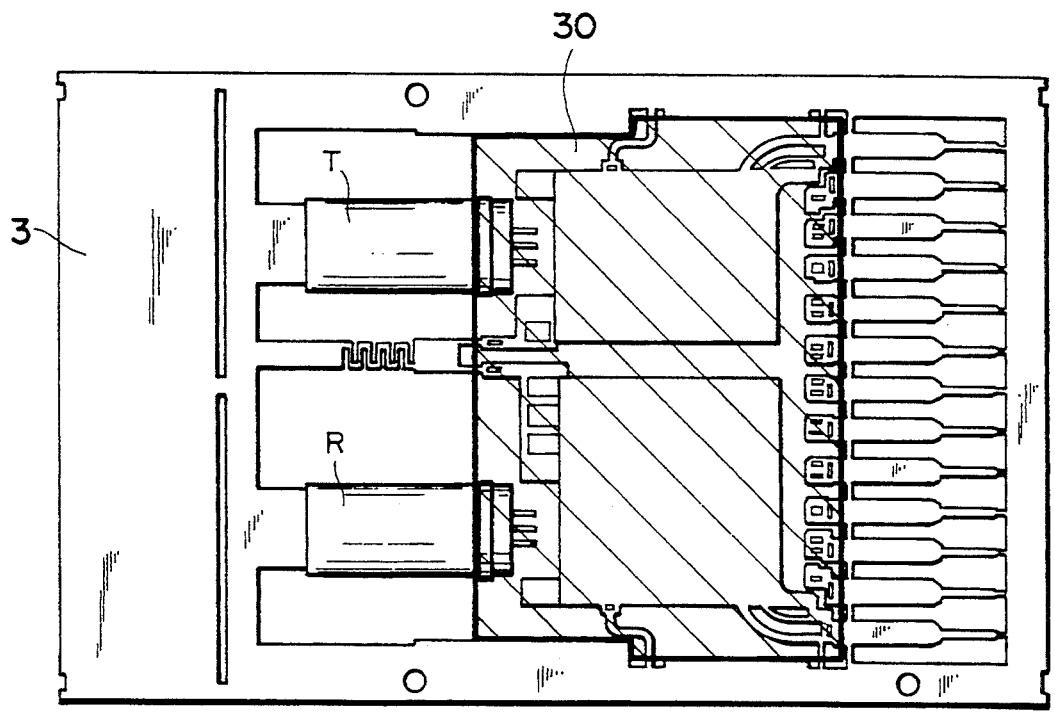
FIG. 3 is a plane view showing a region sealed by mold material.

The sub-module thus formed is thereafter installed into, for example, a mold die for a transfer mold, and a cavity of the mold is filled with the mold material 30. As a result of this process, a region shown as a shaded portion in FIG. 3 is sealed with resin. Note that even though the mold material 30 is poured therein, the structure hardly receives the stress when the resin is poured because the conductive wire 4 is a line.

Figure 4:
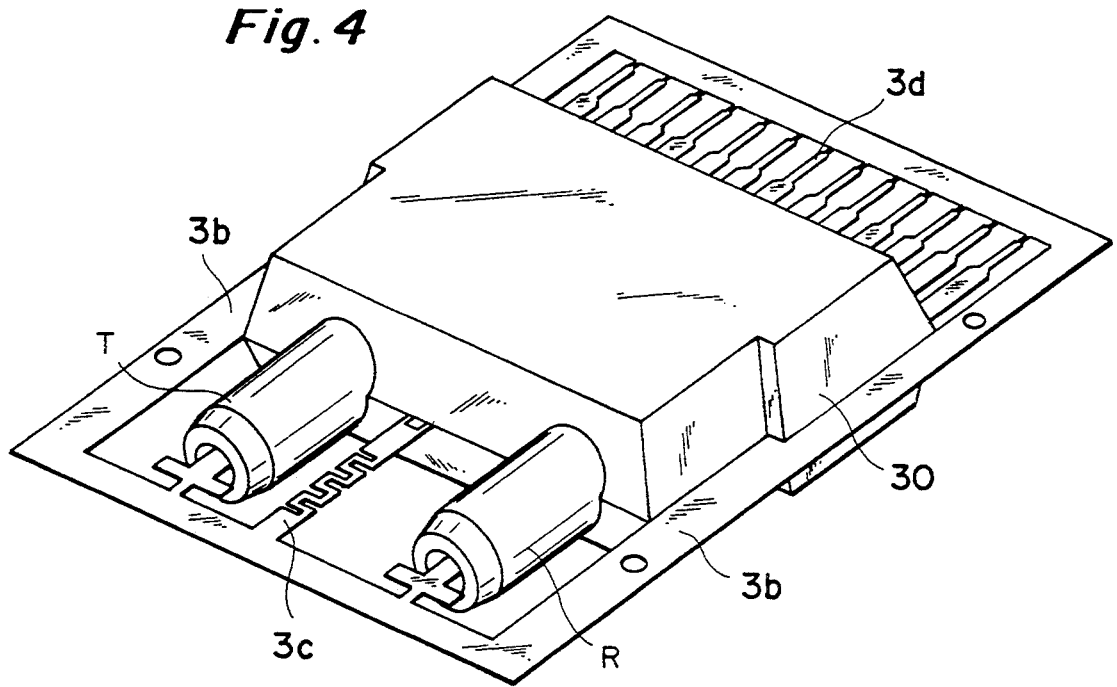
FIG. 4 is a perspective view showing an optical module before unnecessary parts of a lead frame are cut off.
Figure 5:
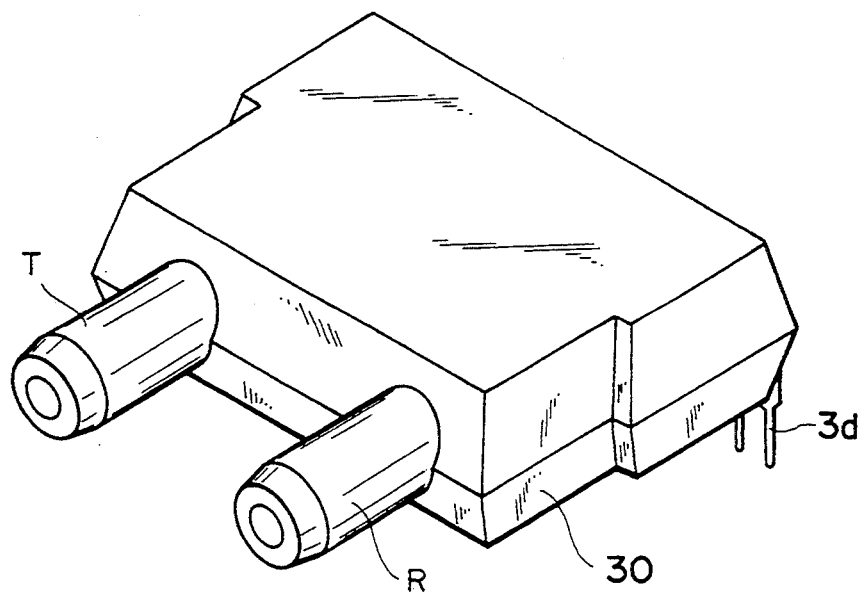
FIG. 5 is a perspective view showing an optical module after unnecessary parts of a lead frame are cut off.
Figure 6:
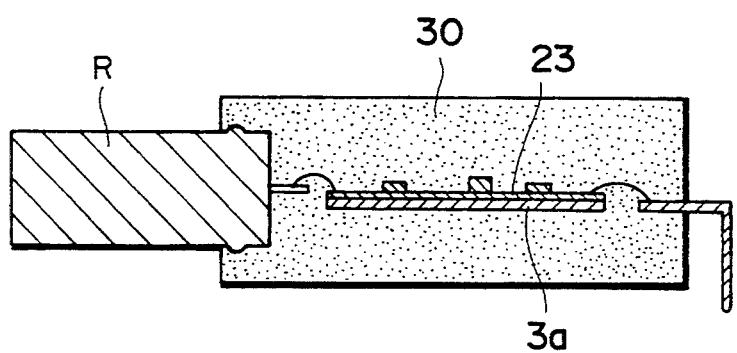
FIG. 6 is a vertical sectional view of an optical module shown in FIG. 5.

In this way, the optical module is sealed by the mold material 30, so that as shown in FIG. 4, the optical module is integrated (see FIG. 6). Thereafter, the unnecessary parts of the lead frame 3 are cut off, and the outer leads of the lead pins 3d are bent, whereby the optical module as shown in FIG. 5 is completed.

Figure 7:
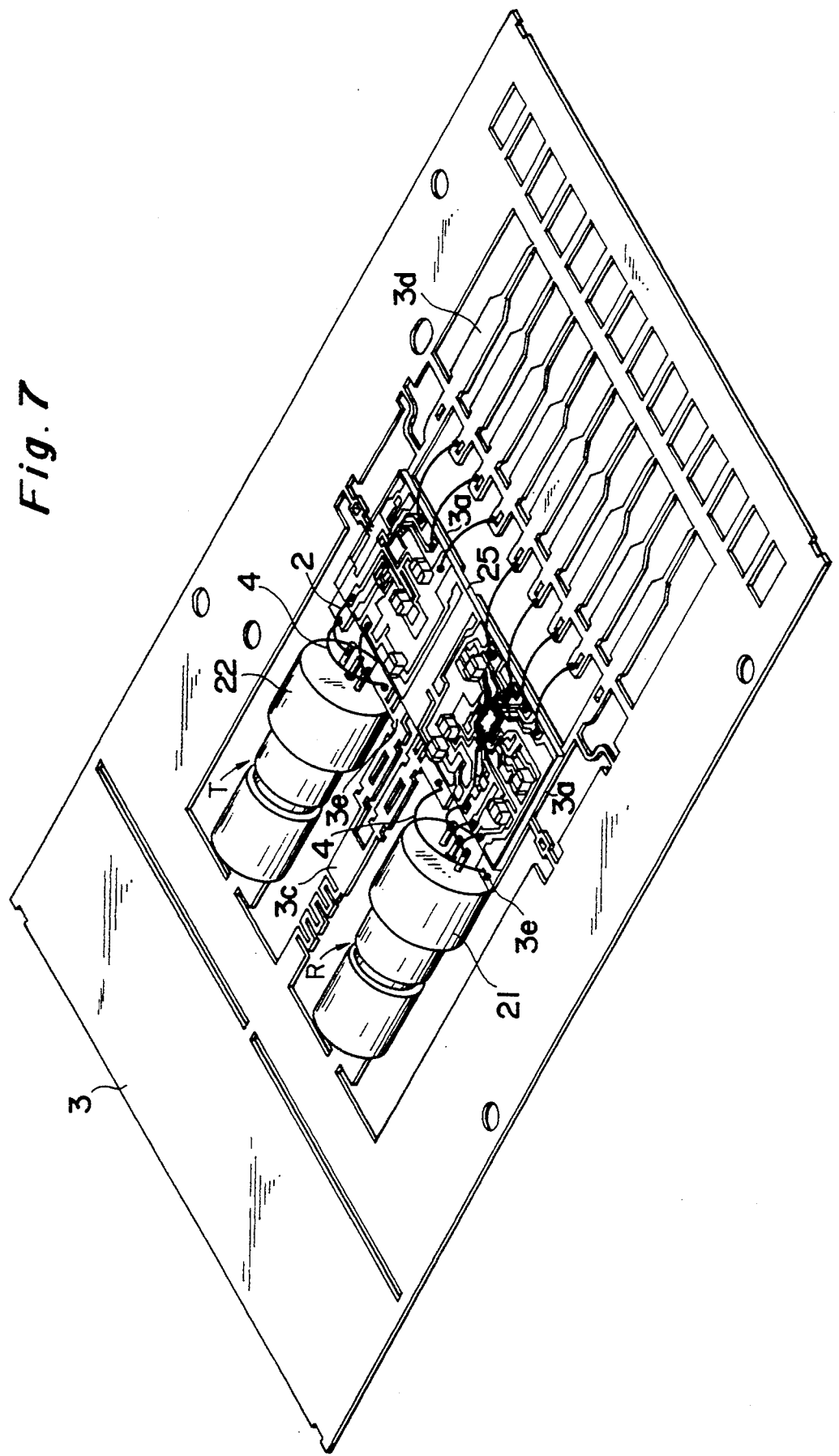
FIG. 7 is a perspective view showing another embodiment of an optical module before molding.
Figure 8:
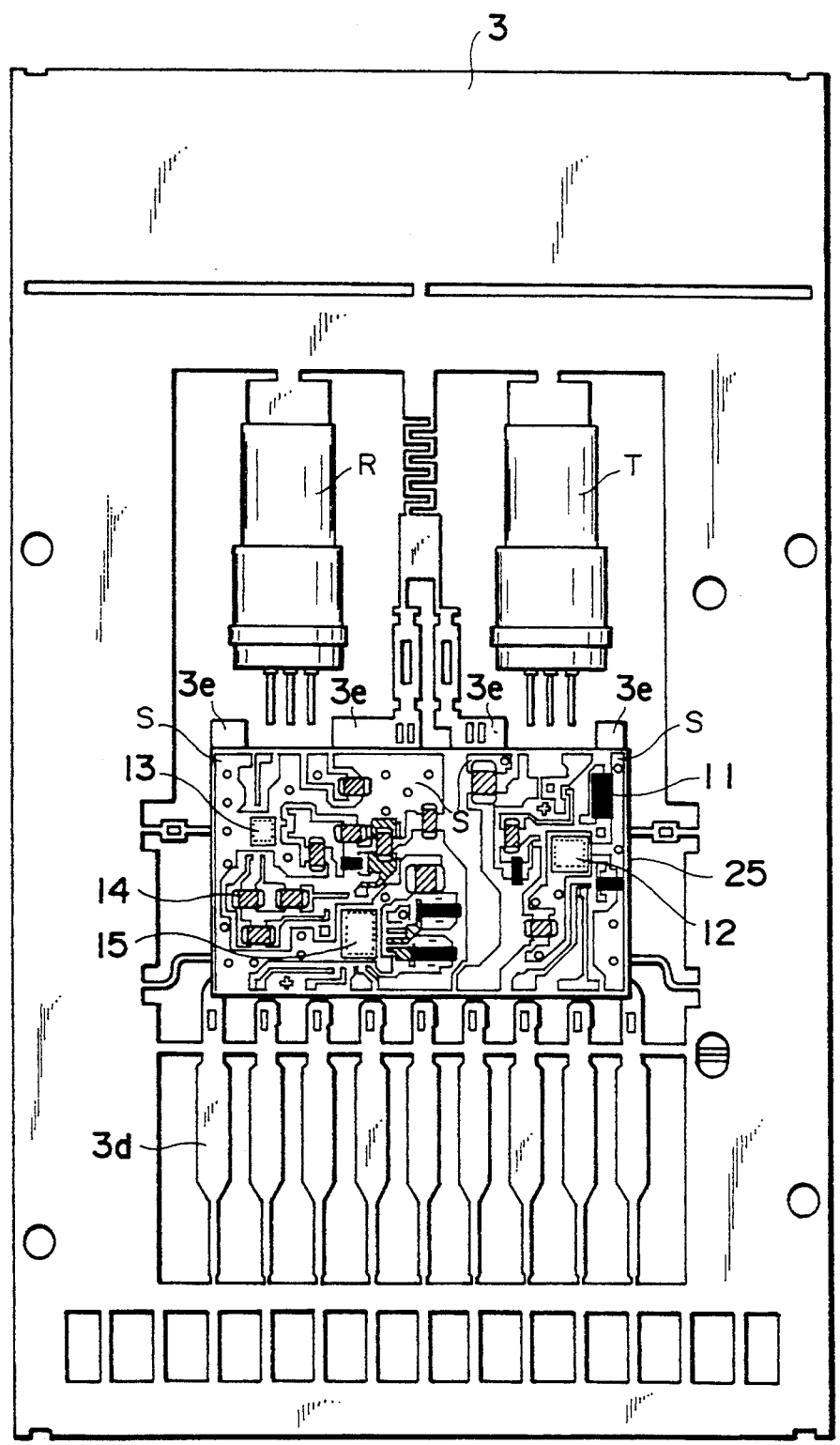
FIG. 8 is a plane view showing an optical module of FIG. 7.

Further, another configuration of the optical module is shown in FIG. 7 and FIG. 8. This optical module differs from the optical module shown in FIG. 1 at the point that the module is for a small-scale link and that a hybrid IC represented by a reference numeral 25 comprises the hybrid ICs 23,24 on the same substrate, but the rest of the structure is the same as the one shown in FIG. 1, and the same components are represented by the same reference numerals.

Figure 9:
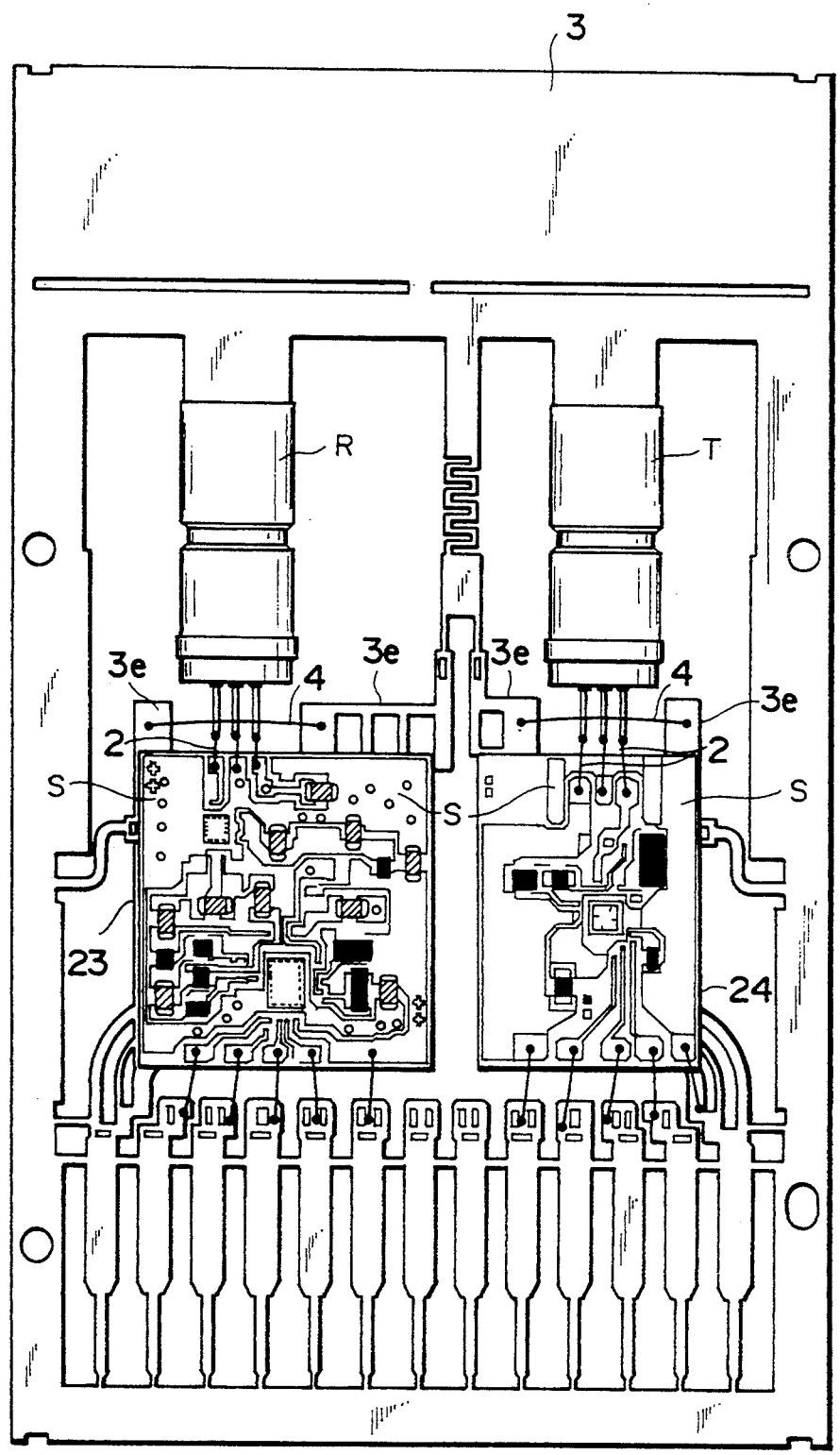
FIG. 9 is a plane view showing the condition that one conductive wire is installed at each of the transmitter side and the receiver side.
Figure 10:
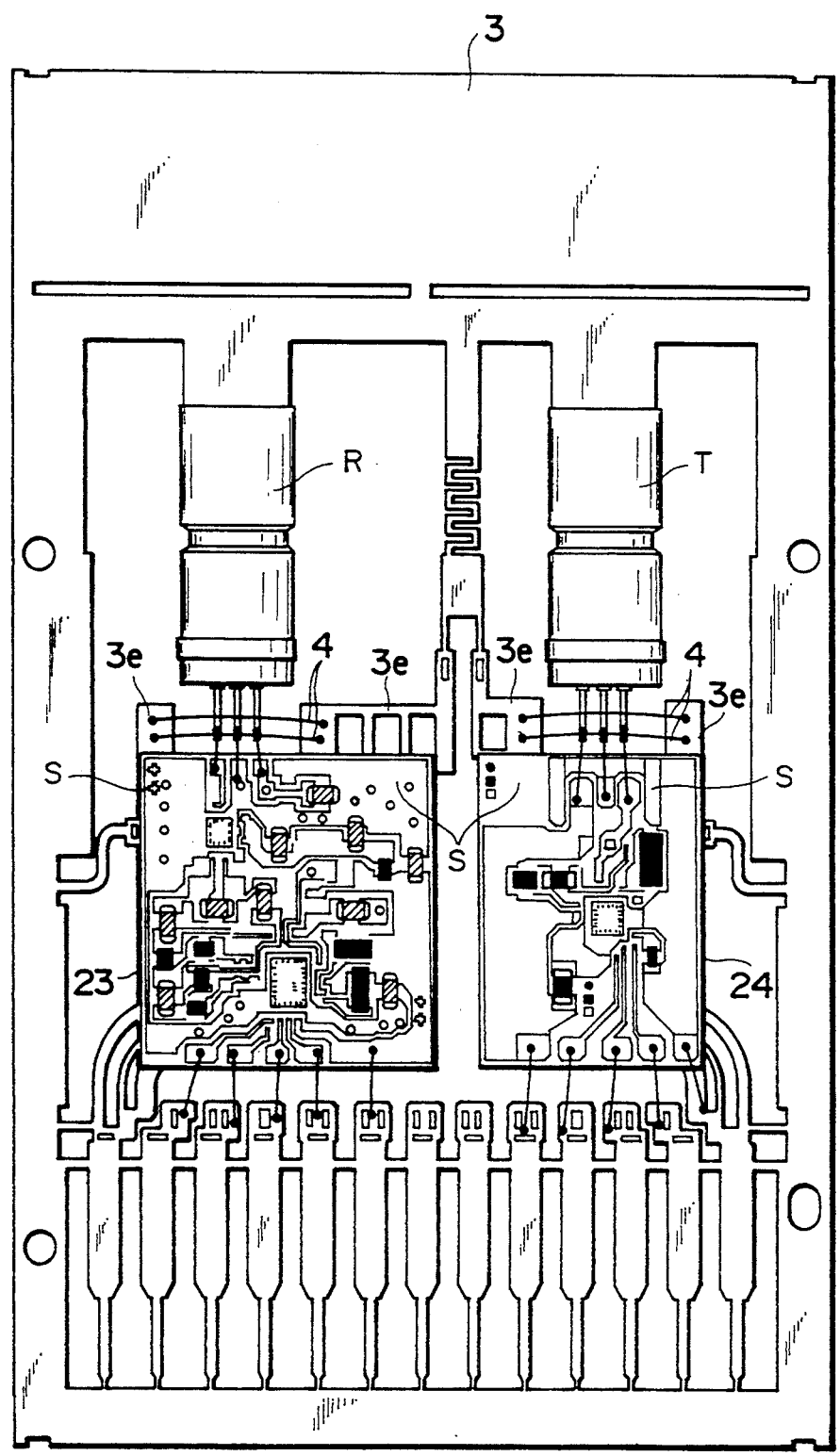
FIG. 10 is a plane view of an optical module showing the condition that two conductive wires are installed at each of the transmitter side and the receiver side.
Figure 11:
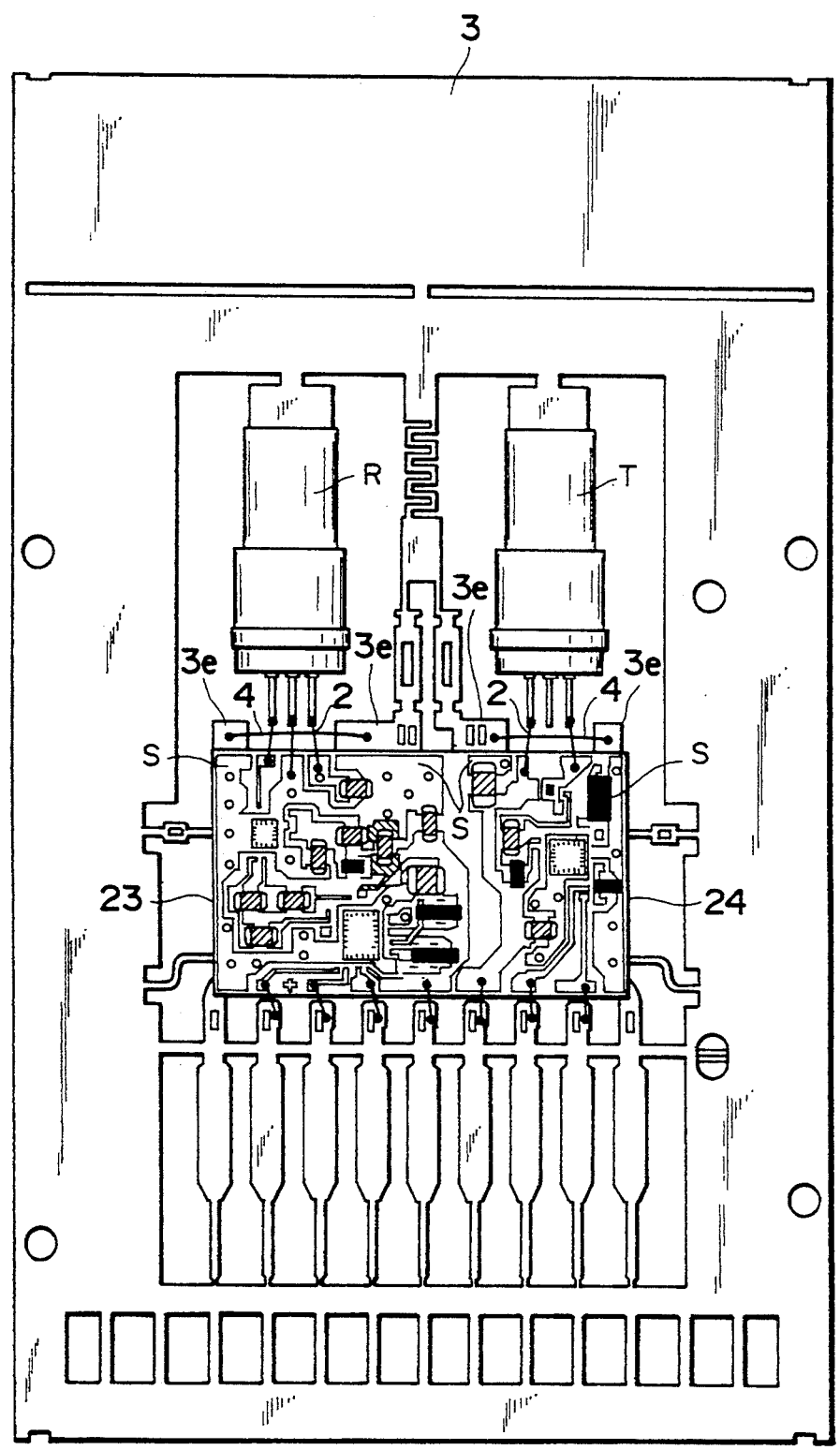
FIG. 11 is a plane view showing the condition that one conductive wire is installed at each of the transmitter side and the receiver side.
Figure 12:
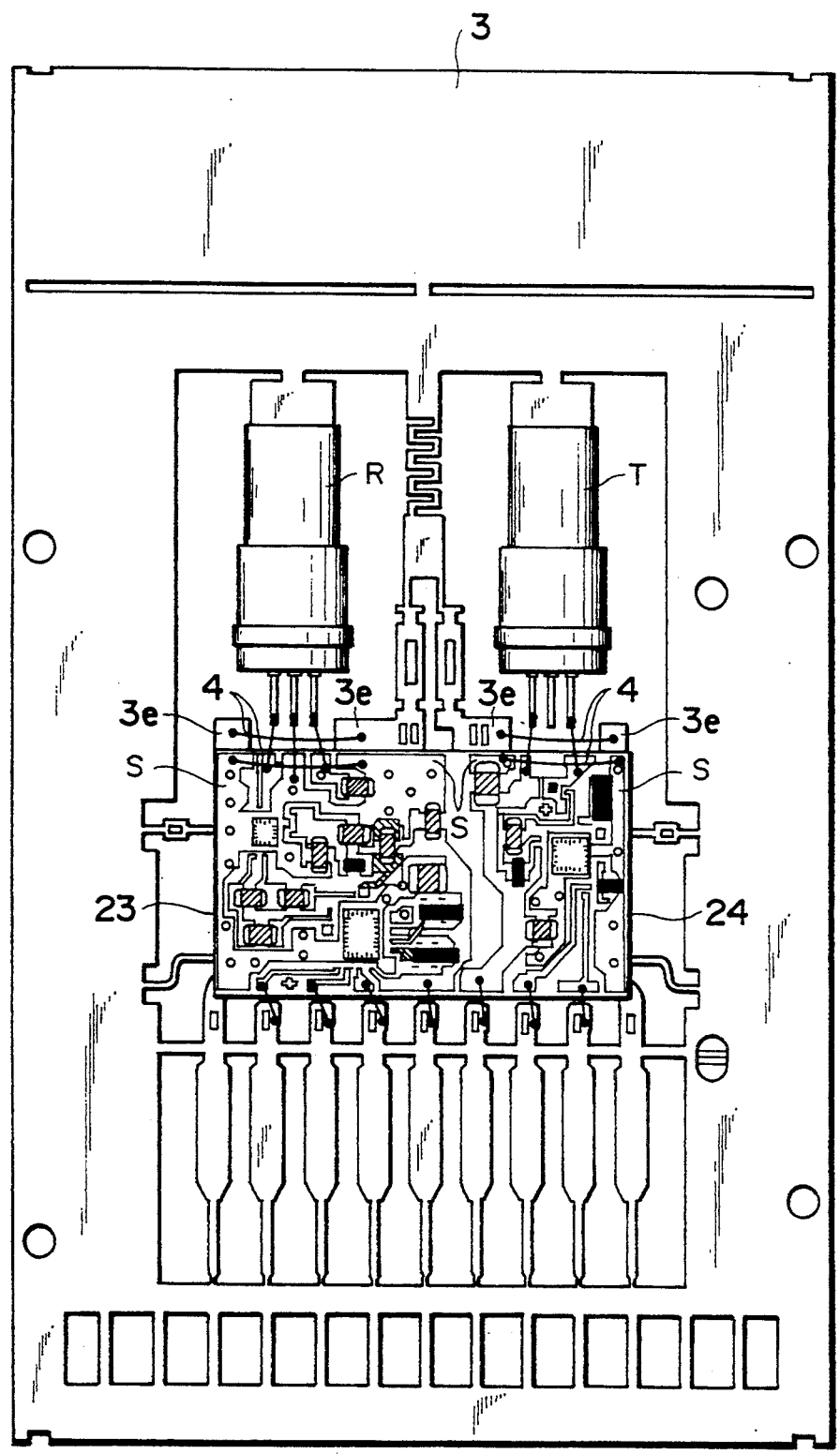
FIG. 12 is a plane view of an optical module showing the condition that two conductors are installed at each of the transmitter side and the receiver side.

Here, optical modules thus constructed were used to measure a noise included in signal components. For the measurement, a number of conductive wires 4 which are provided at the connection region between the optical connector and the hybrid IC was changed. For example, FIG. 9 and FIG. 11 show the condition that one conductive wire 4 was provided at each of the transmitter side and the receiver side, and FIG. 10 and FIG. 12 show the condition that two conductive wires 4 were provided at each of the transmitter side and the receiver side. Note that for the measurement, a noise level (crosstalk) for the receiver side was measured by inputting a test signal to the optical connector R and comparing the sensitivity of the receiver side in the case of providing the optical connector T with the ECL(-Emitter Coupled Logic) signal and without the ECL signal.

Figure 13:
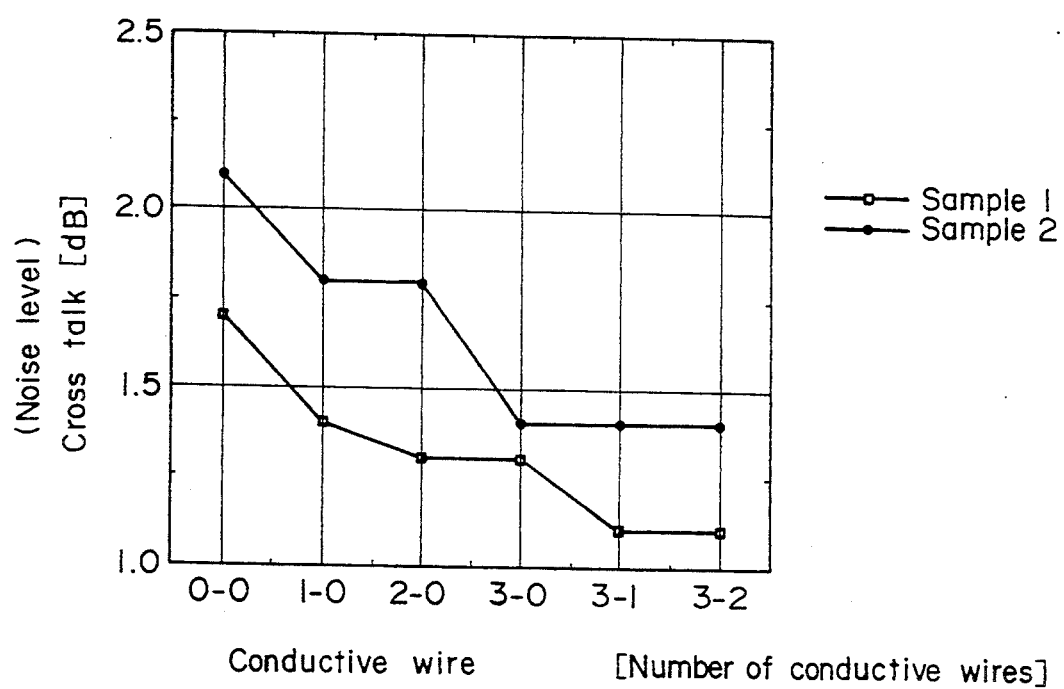
FIG. 13 is a graph of this showing a measurement result.

The measurement result is shown in FIG. 13. "3-1" and others on a horizontal axis of the graph shown in FIG. 13 are that a number on left hand represents the number of the conductive wires 4 provided at the receiver side, and that a number on right hand represents the number of the conductive wires 4 provided at the transmitter side. In FIG. 13, "sample 1" and "sample 2" represent the different optical modules, and the same measurement was performed for every modules, and each result is shown.

In result, it was studied that even in the case that the one conductive wire 4 was provided at the connection region of the receiver side which was a noise source, the noise level was reduced. It was also studied that as the number of the conductive wires 4 increased, the noise level tended to decrease. For example, when the three conductive wires 4 are provided at the receiver side and one is provided at the transmitter side, the noise level is reduced to about 1.5 dB.

Figure 14:
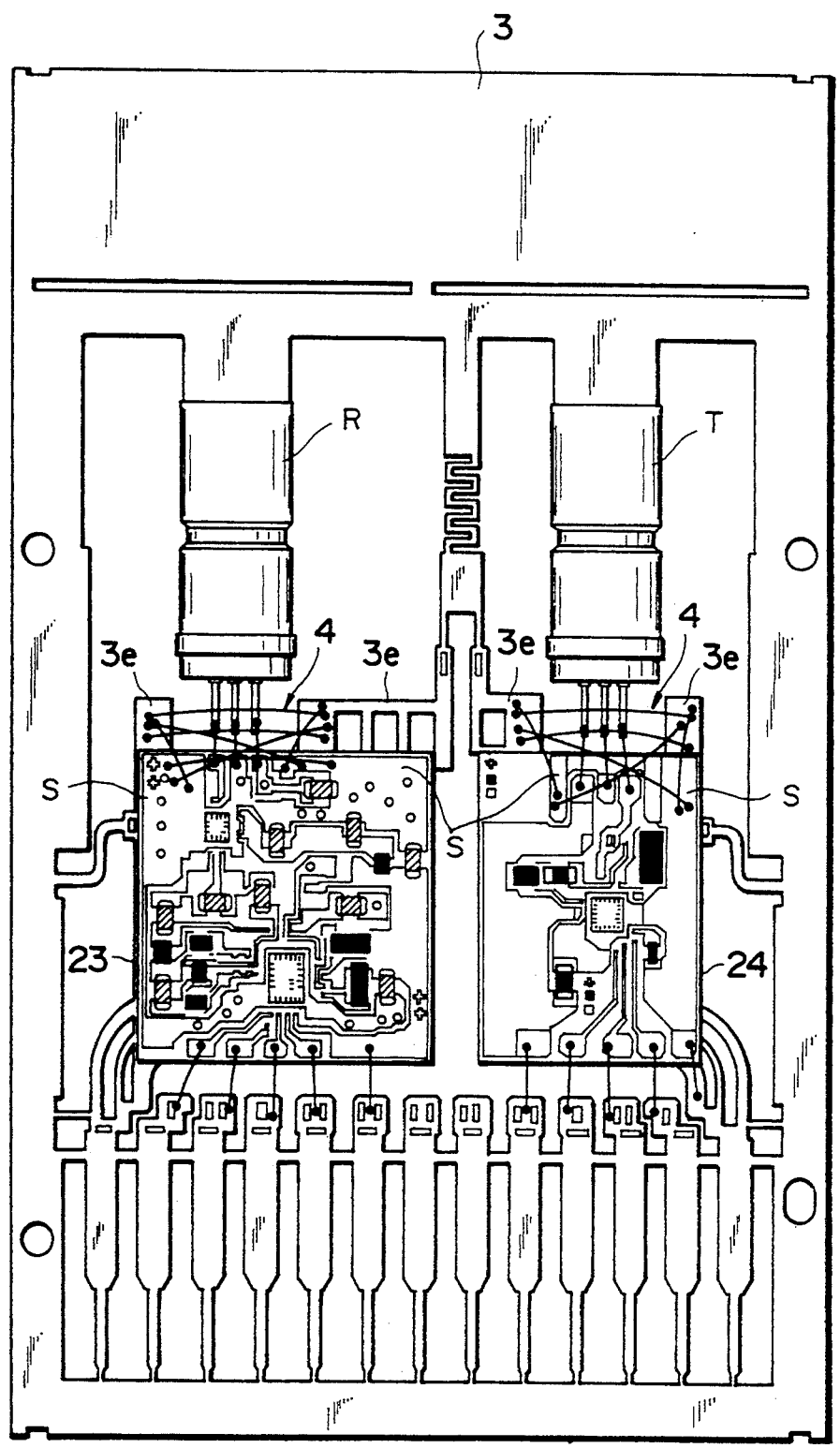
FIG. 14 is a plane view of an optical module showing the condition of another conductive wire.
Figure 15:
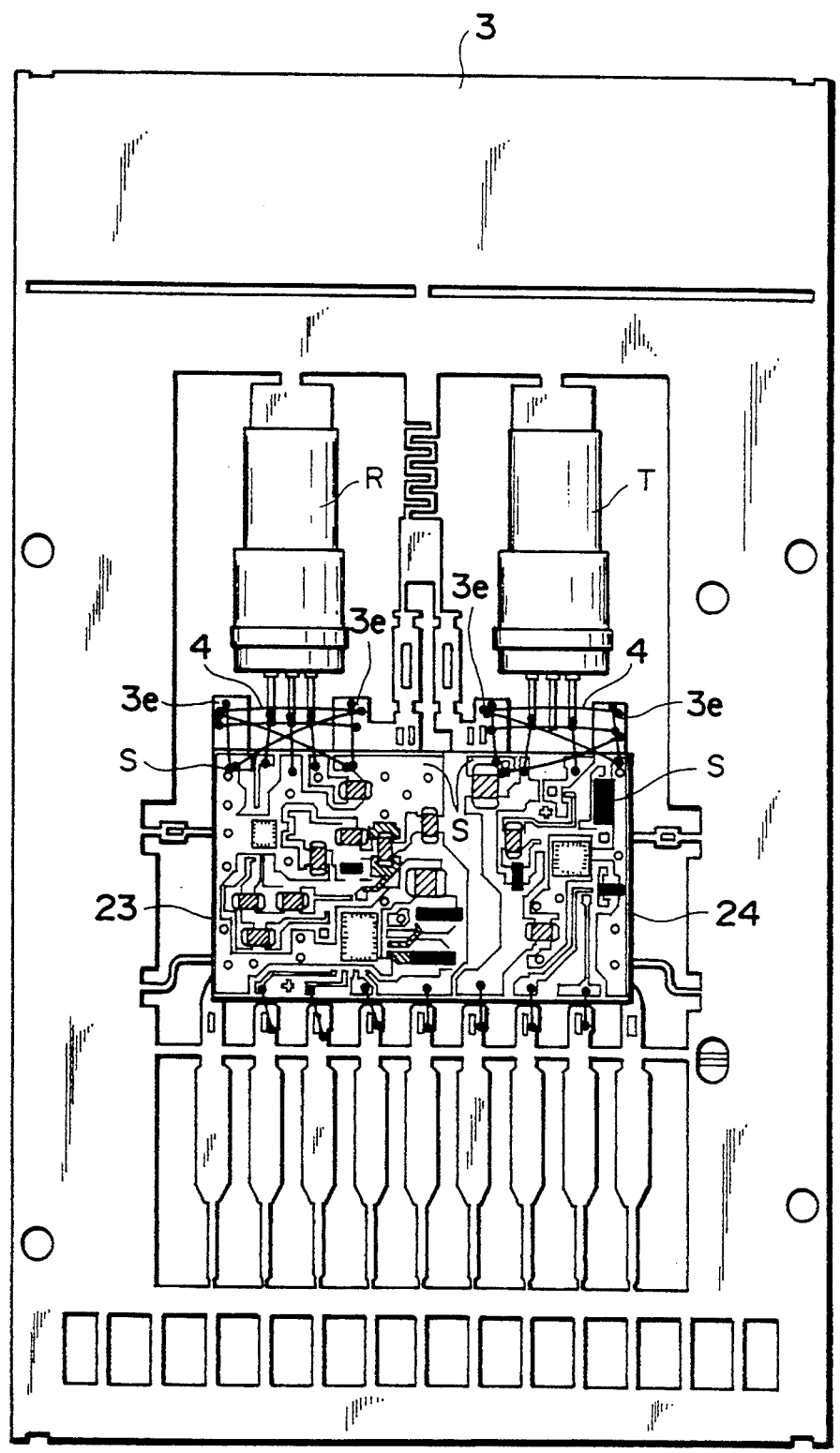
FIG. 15 is a plane view of an optical module showing the condition of another conductive wire.
Figure 16:
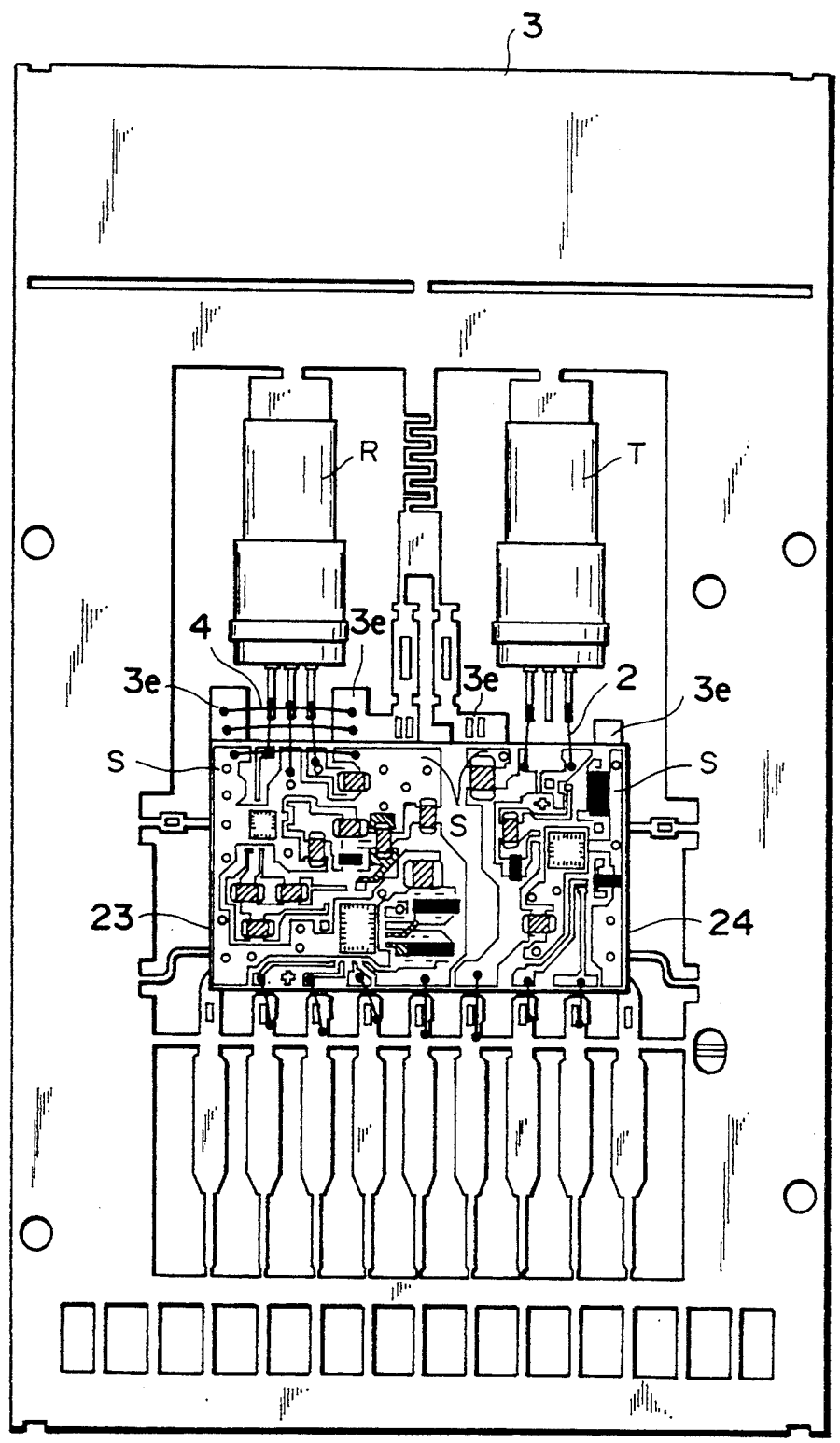
FIG. 16 is a plane view showing another embodiment of an optical module.

Further, as another installation form of the conductive wire 4, the conductive wire 4 is possible to be a mesh shape by installing a large number of the conductive wires 4 as shown in FIG. 14 and FIG. 15. In this case, as described above, the ground pattern S is also used to install. The conductive wires 4 are installed in such a form, so that the electromagnetic shielding effect and the ground strengthen.

In each of the embodiments as described above, the conductive wires 4 are provided at the connection regions both between the optical connector R and the hybrid IC 23, and between the optical connector T and the hybrid IC 24, but it is also possible that the conductive wire 4 is provided at either one of them.

Figure 17:
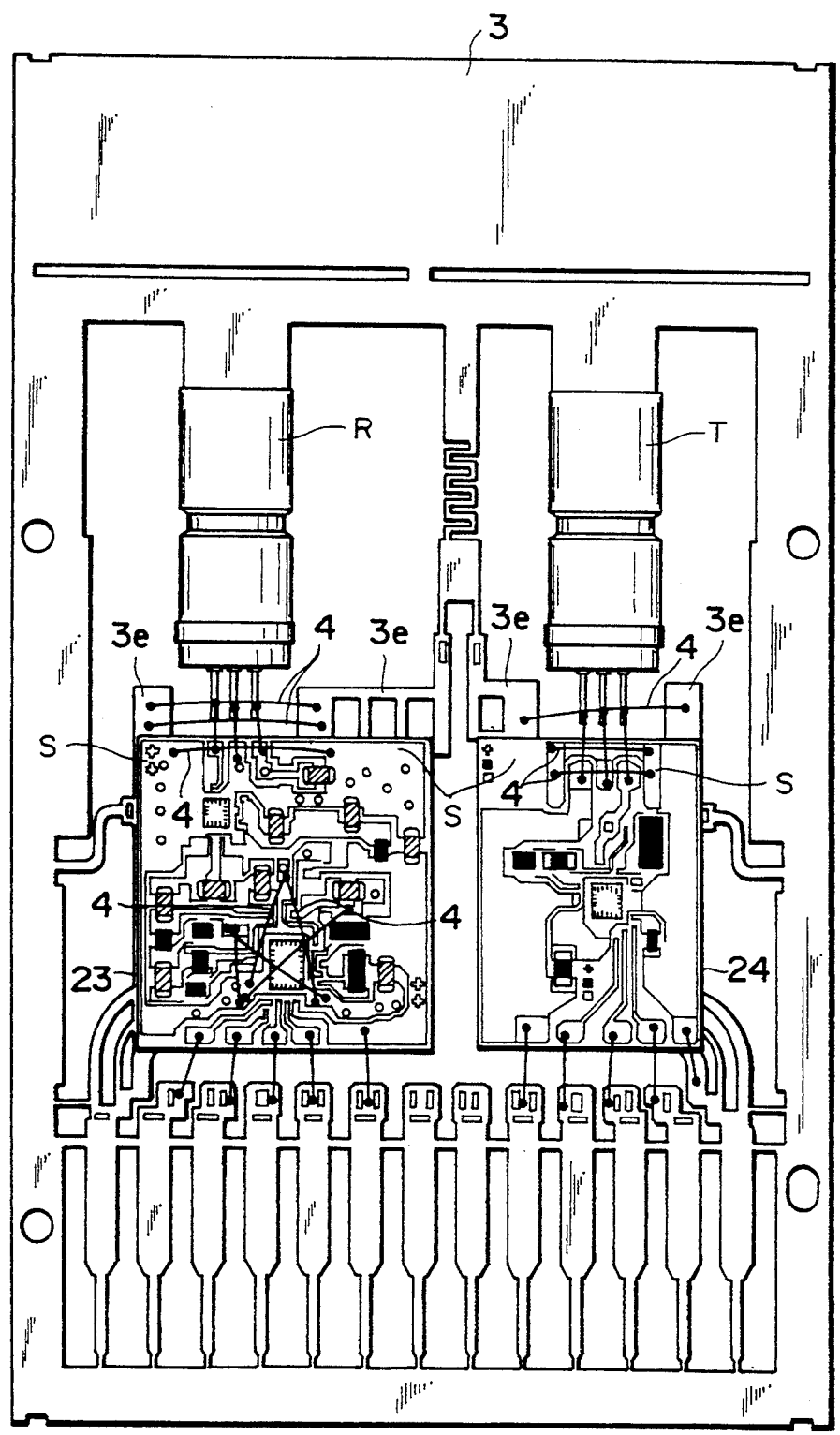
FIG. 17 is a plane view showing another embodiment of an optical module.

Further, for the ICs mounted on the hybrid IC 23 and 24, it is possible that the conductive wires 4 are provided and the electrical shielding is applied to strengthen the GND. In this case, for example, as shown in FIG. 17, the structure that the conductive wires 4 are across the comparator IC 15 is preferred. At this time, both ends of the conductive wire 4 may be connected to the ground pattern S formed on the mounting surface of each of the hybrid IC 23 and 24.

As descried above, the optical module is illustrated as comprising both receiving and transmitting functions, but it is of course possible that the conductive wire 4 as described above is provided at the optical module comprising one of the two functions.

Second Embodiment

The most suitable location of the conductive wire 4 was studied in order to provide an optical module which reduces the effect of noise caused by an atmospheric propagation for electric wave (mainly crosstalk from transmitter side) or the GND/power lines and which provides the good productivity.

Figure 18:
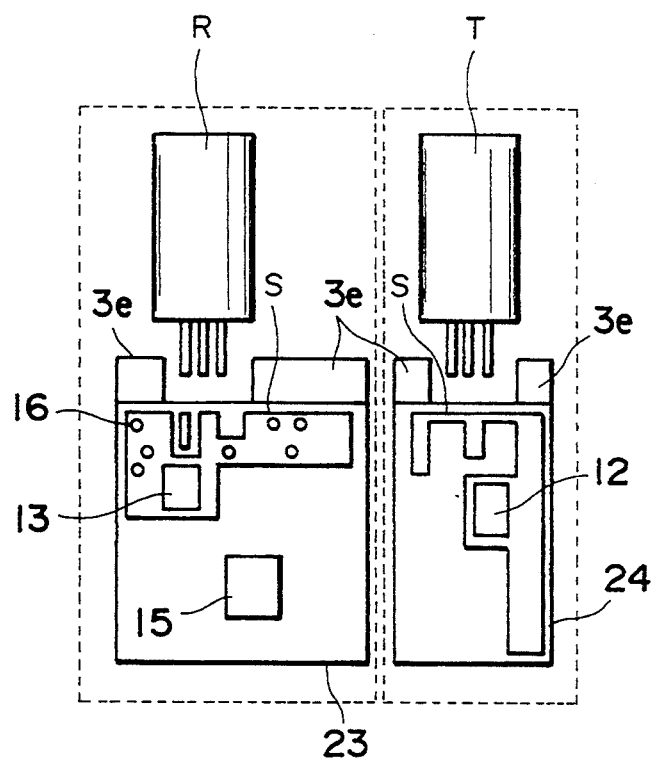
FIG. 18 is a schematic plane view showing the main points of the optical module which was used in the measurement.
Figure 19C:
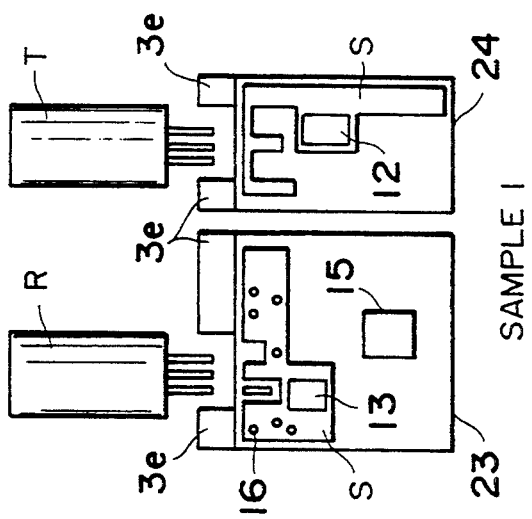
FIGS. 19A to 19I are schematic plane views showing the locations of the conductive wires on the optical modules which were used in each of the measurements.
Figure 19B:
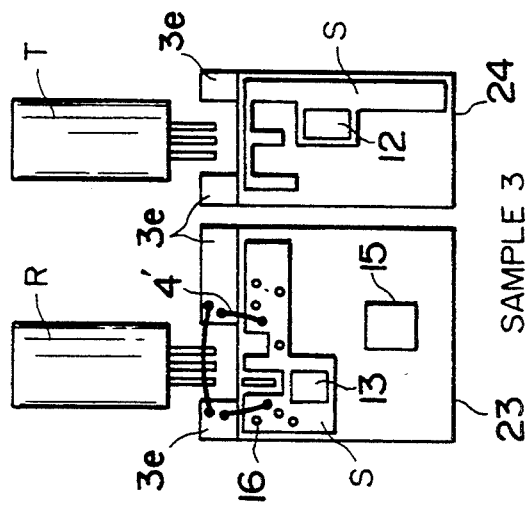
Figure 19A:
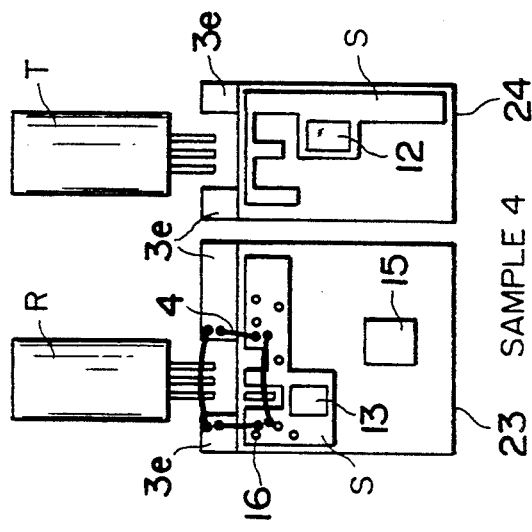
Figure 19F:
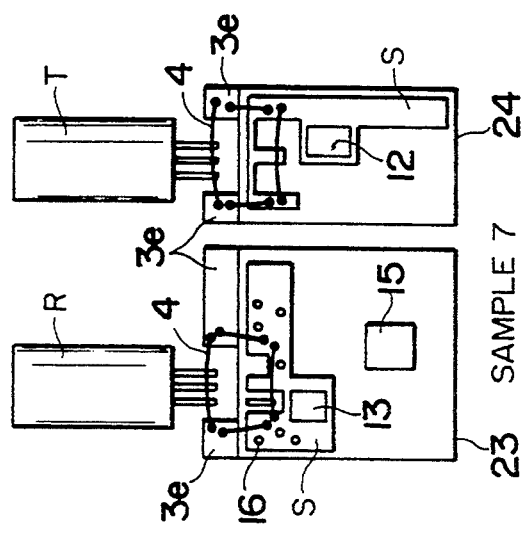
Figure 19E:
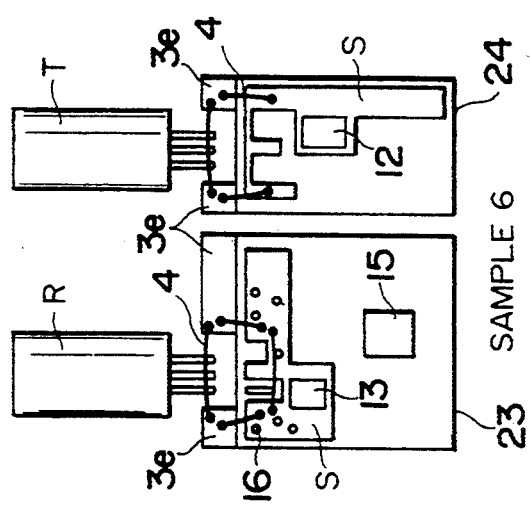
Figure 19D:
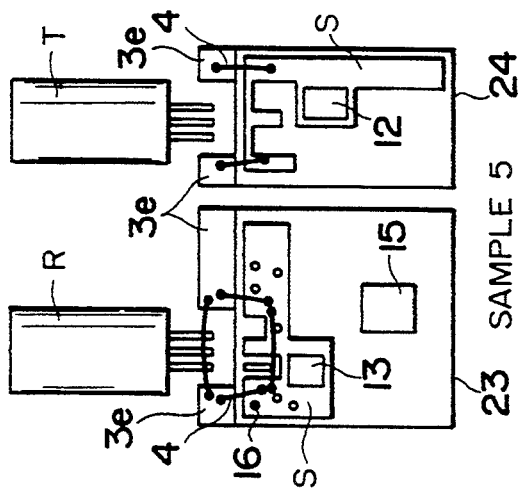
Figure 19G:
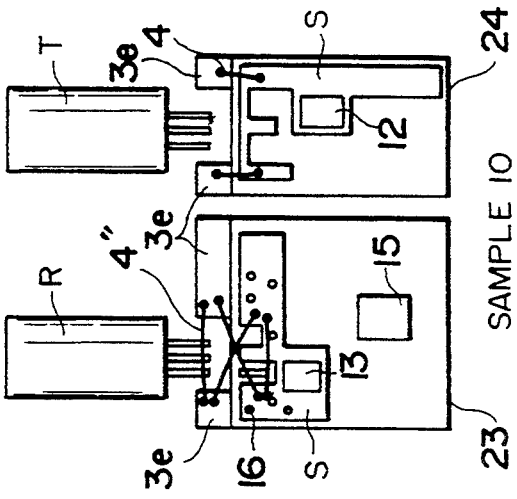
Figure 19H:
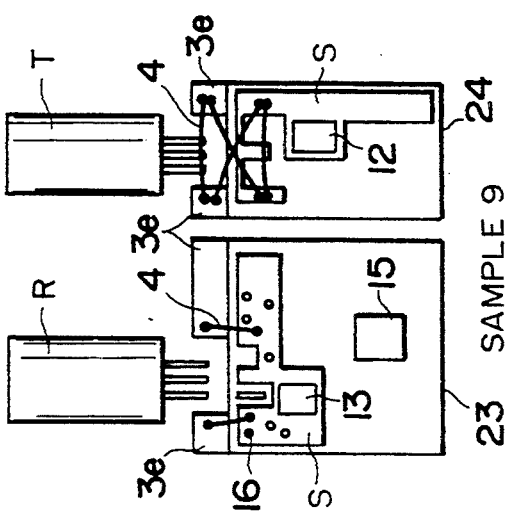
Figure 19I:
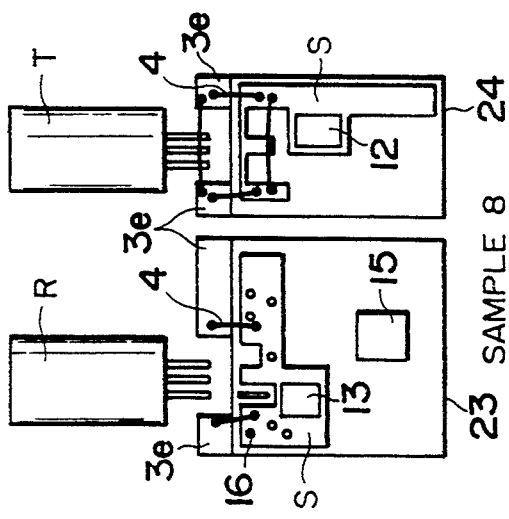

For an optical module shown in FIG. 18, the location of the conductive wire 4 was varied, and a noise included in the signal components was measured. In this case, in the same way as the first embodiment, a noise level (crosstalk) for the receiver side was measured by inputting a test signal to the optical connector R and comparing sensitivity of the receiver side in the case of providing the transmitter side with the ECL (Emitter Coupled Logic) signal and without the ECL signal.

Note that FIG. 18 schematically shows the main parts of the optical module which was used in the measurement. In FIG. 18, the same components as the optical module shown in FIG. 2 are represented by the same reference numerals. The wire 2 is omitted in FIG. 18, and the reference numeral 16 represents a through-hole penetrating in a direction of the hybrid IC 23 thickness.

Figure 20:
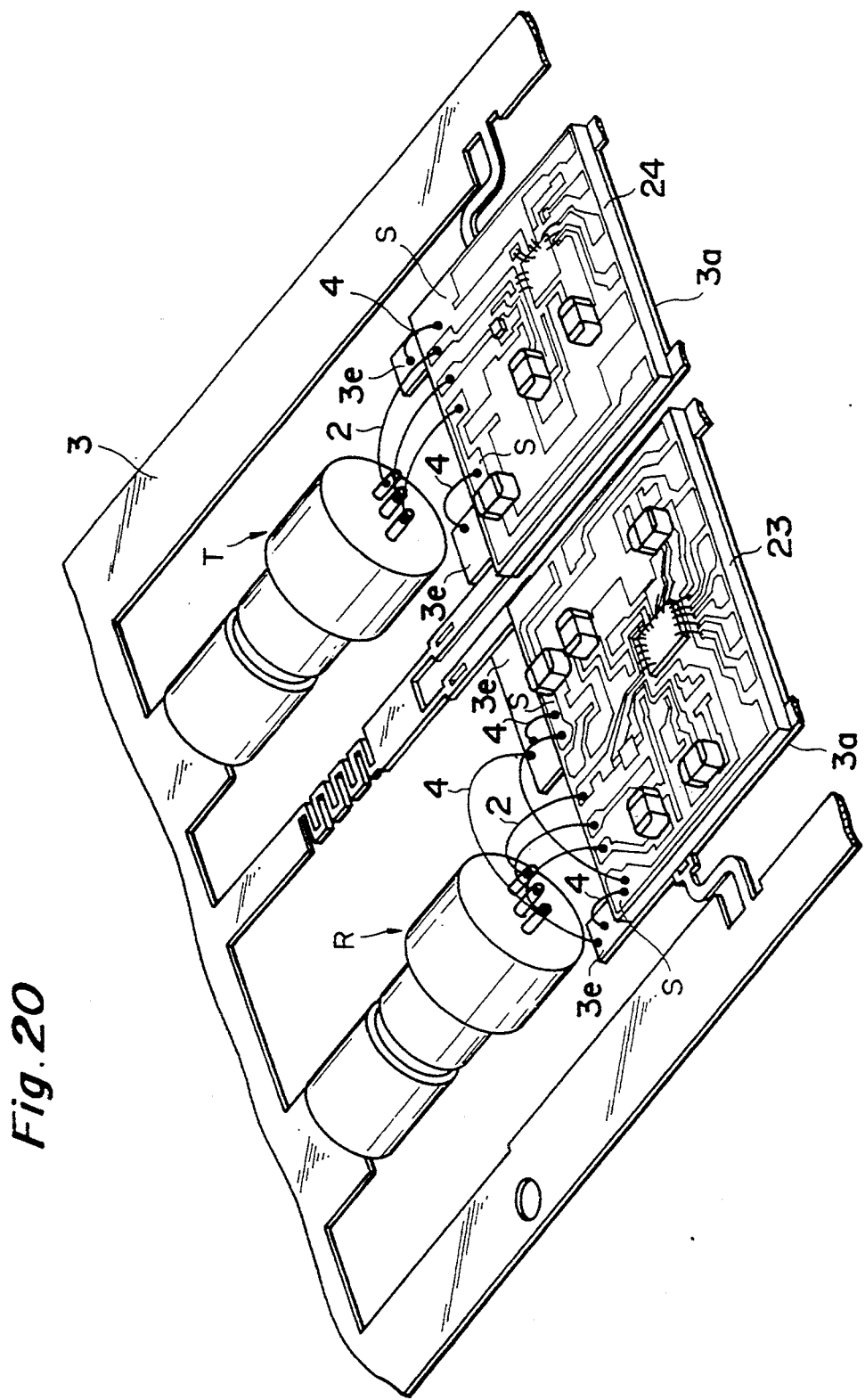
FIG. 20 is a partially perspective view showing the optical module shown in FIG. 19D.

For the measurement, the location of the conductive wire 4 was varied as samples 1 and 3–10 shown in FIG. 19A to FIG. 19I. Note that the conductive wire 4 was not provided in the sample 1 shown in FIG. 19A. Further, as one example, FIG. 20 shows the enlarged region where the conductive wire 4 is placed in the sample 5.

The measurement result is shown in Table 1.

From the result, it is understood that the sample 1, in which the conductive wire 4 is not provided, has the worst sensitivity and has the large amount of degradation due to crosstalk.

The reasons for the worst reception sensitivity are considered hereunder. In the optical connector R side of the samples 3–9, each of the conductive wire is provided in the vertical direction of FIGS. 19B to 19I respectively, to connect the connection part 3e with the ground pattern S (as one example, the conductive wire is represented by a reference numeral 4' in FIG. 19B), and further, in the sample 10, the conductive wire is provided in a direction of crossing the connection part between the optical connector R and the hybrid IC 23 (the conductive wire is represented by a reference numeral 4" in FIG. 19I). It is considered that the conductive wire, which has low impedance, provided in this part serves to strengthen the GND nearby the preamplifier IC 13. Consequently, it seems that the sample 1 which has no conductive wires in this part tends to oscillate, which makes the reception sensitivity worse. It is considered that for the sample 1, the amount of degradation due to crosstalk is very large because no conductive wire 4 is provided thereto.

Next, as described above, for the samples 3–10, oscillation does not occur in the circuit, and based on this assumption, the effects of the conductive wire 4 against the crosstalk are considered.

In comparison of the samples 8 and 9, the following matter can be studied. When the electromagnetic shield is not sufficient, i.e., when the conductive wire 4 is provided not to surround the circumference of the connection part between the optical connector R and the hybrid IC 23 in loop or not to cross this connecting part, to provide the conductive wire 4 to surround the connection part (noise source) of the optical connector T side in loop is more effective in crosstalk. According to the measured data for other samples, when the electromagnetic shield for the optical connector R side is sufficient, the condition of the arrangement of the conductive wires 4 on the optical connector T side has less effect in decrease of the crosstalk.

From the above studies, regarding the characteristics of the optical module, the location of the conductive wire 4 is preferable in the following order of (1), (2), and (3).

(1) To strengthen the GND, the connection part 3e of the lead frame 3 and the ground patterns S on the hybrid IC are connected by the conductive wire 4.

(2) The conductive wire 4 is provided to surround the connection part between the optical connector R side and the hybrid IC, or to cross the connection part.

(3) The conductive wire 4 is provided to surround the connection part between the optical connector T and the hybrid IC.

Figure 21:
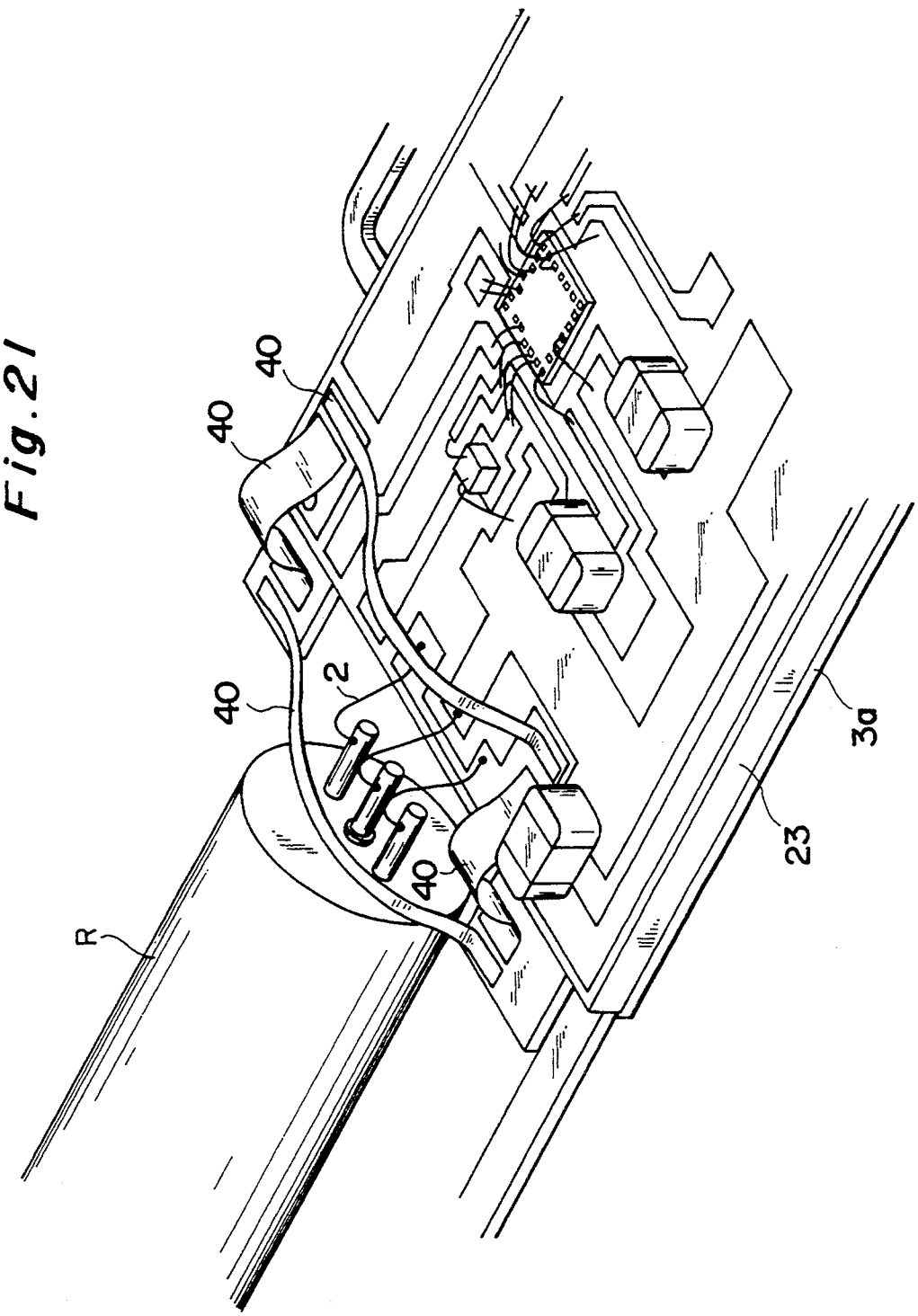
FIG. 21 is schematic perspective view showing an another embodiment of conductive wires.

In the above-described first and second embodiments, the conductive wire 4 is illustrated as a 150 μm diameter Al bonding wire, but it is not limited to this member, for example, as shown in FIG. 21, a flat ribbon-shaped wire 40 which is called ribbon-bond or equivalents may be used.

TABLE I

| Sample No. | Reception sensitivity and the amount of degradation due to crosstalk | | |
|---|---|---|---|
| | Reception sensitivity (TxOff) | Reception sensitivity (TxOn) | The amount of degradation due to crosstalk |
| 1 | −31.80 | −24.75 | 7.05 |
| 3 | −36.40 | −35.00 | 1.40 |
| 4 | −36.70 | −35.65 | 1.05 |
| 5 | −36.95 | −35.75 | 1.20 |
| 6 | −36.65 | −35.75 | 0.90 |
| 7 | −36.65 | −35.65 | 1.00 |
| 8 | −37.00 | −35.60 | 1.40 |
| 9 | −36.80 | −34.70 | 2.10 |

TABLE I-continued

| Sample No. | Reception sensitivity and the amount of degradation due to crosstalk | | |
|---|---|---|---|
| | Reception sensitivity (TxOff) | Reception sensitivity (TxOn) | The amount of degradation due to crosstalk |
| 10 | −36.10 | −34.95 | 1.15 |
| Unit | dBm | dBm | dB |

What is claimed is:

1. An optical module sealed by mold material comprising:
    an optical connector comprising a light receiving device for converting an optical signal into an electric signal;
    a first substrate comprising a circuit which is electrically connected to an output terminal of said light receiving device through a signal connecting wire, for processing an electric signal coming from the output terminal;
    a mounting substrate for mounting said first substrate; and
    a conductive wire placed nearby a connection part between said optical connector and said first substrate without contacting said signal connecting wire;
    said mounting substrate comprising a first reference potential region being of a part of the mounting substrate and projecting outside from a part where said first substrate is mounted;
    said first substrate comprising a second reference potential region on a surface of the first substrate, which region is electrically connected to said mounting substrate;
    one end of said conductive wire being connected to one of said first reference potential region and said second reference potential region, and the other end of said conductive wire being connected to one of said first reference potential region and said second reference potential region.

2. An optical module according to claim 1, wherein said conductive wire is placed at one side bordering said signal connecting wire, and one end of the conductive wire is connected to said first reference potential region, and the other end of the conductive wire is connected to said second reference potential region.

3. An optical module according to claim 2, wherein said first substrate comprises an amplifier for amplifying an output signal of said light receiving device; and
    one end of said conductive wire is connected to said second reference potential region nearby the part where the amplifier is placed.

4. An optical module according to claim 2, wherein said conductive wire is a bonding wire.

5. An optical module according to claim 2, wherein said conductive wire is a flat ribbon-shaped wire.

6. An optical module according to claim 2, wherein said mounting substrate is a part of a lead frame.

7. An optical module according to claim 2, wherein the potential applied to said first and second reference potential regions is a ground potential.

8. An optical module according to claim 1, wherein said conductive wire is placed, crossing with said signal connecting wire, and one end of said conductive wire is connected to said first reference potential region and the other end of said conductive wire is connected to said second reference potential region.

9. An optical module according to claim 8, wherein said conductive wire is a bonding wire.

10. An optical module according to claim 8, wherein said conductive wire is a flat ribbon-shaped wire.

11. An optical module according to claim 8, wherein said mounting substrate is a part of a lead frame.

12. An optical module according to claim 8, wherein the potential applied to said first and second reference potential regions is a ground potential.

13. An optical module according to claim 1, wherein said conductive wire is placed at a plurality of places so that a region where said signal connecting wire is placed is surrounded.

14. An optical module according to claim 13, wherein said conductive wire is a bonding wire.

15. An optical module according to claim 13, wherein said conductive wire is a flat ribbon-shaped wire.

16. An optical module according to claim 13, wherein said mounting substrate is a part of a lead frame.

17. An optical module according to claim 13, wherein the potential applied to said first and second reference potential regions is a ground potential.

18. An optical module sealed by mold material comprising:
- a first optical connector comprising a light receiving device for converting an optical signal into an electric signal;
- a first substrate comprising a circuit which is electrically connected to an output terminal of said light receiving device through a first signal connecting wire, for processing an electric signal coming from the output terminal;
- a first mounting substrate for mounting said first substrate;
- a second optical connector comprising a light emitting device for converting an electric signal into an optical signal;
- a second substrate comprising a circuit which is electrically connected to an input terminal of said light emitting device through a second signal connecting wire, for applying an electric signal to the input terminal;
- a second mounting substrate for mounting said second substrate, electrically connected to said first mounting substrate; and
- a conductive wire placed nearby a connection part between said first optical connector and said first substrate without contacting said first signal connecting wire;
- said first mounting substrate comprising a first reference potential region being of a part of the first mounting substrate and projecting outside from a part where said first substrate is mounted;
- said first substrate comprising a second reference potential region on a surface of said first substrate, which region is electrically connected to said first mounting substrate;
- one end of said conductive wire being connected to one of said first reference potential region and said second reference potential region, and the other end of said conductive wire being connected to one of said first reference potential region and said second reference potential region.

19. An optical module according to claim 18, wherein said conductive wire is placed at one side bordering said first signal connecting wire, and one end of said conductive wire is connected to said first reference potential region, and the other end of said conductive wire is connected to said second reference potential region.

20. An optical module according to claim 19, wherein said conductive wire is a bonding wire.

21. An optical module according to claim 19, wherein said conductive wire is a flat ribbon-shaped wire.

22. An optical module according to claim 19, wherein said first and second mounting substrates are a part of a lead frame.

23. An optical module according to claim 19, wherein the potential applied to said first and second reference potential regions is a ground potential.

24. An optical module according to claim 18, wherein said conductive wire is placed at a plurality of places so that a region where said first signal connecting wire is placed is surrounded.

25. An optical module according to claim 24, wherein said conductive wire is a bonding wire.

26. An optical module according to claim 24, wherein said conductive wire is a flat ribbon-shaped wire.

27. An optical module according to claim 24, wherein said first and second mounting substrates are a part of a lead frame.

28. An optical module according to claim 24, wherein the potential applied to said first and second reference potential regions is a ground potential.

29. An optical module according to claim 18, wherein said conductive wire is placed, crossing with said first signal connecting wire, and one end of said conductive wire is connected to said first reference potential region and the other end of said conductive wire is connected to said second reference potential region.

30. An optical module according to claim 29, wherein said conductive wire is a bonding wire.

31. An optical module according to claim 29, wherein said conductive wire is a flat ribbon-shaped wire.

32. An optical module according to claim 29, wherein said first and second mounting substrates are a part of a lead frame.

33. An optical module according to claim 29, wherein the potential applied to said first and second reference potential regions is a ground potential.

34. An optical module sealed by mold material comprising:
- a first optical connector comprising a light receiving device for converting an optical signal into an electric signal;
- a first substrate comprising a circuit which is electrically connected to an output terminal of said light receiving device through a first signal connecting wire, for processing an electric signal coming from the output terminal;
- a first mounting substrate for mounting said first substrate;
- a second optical connector comprising a light emitting device for converting an electric signal into an optical signal;
- a second substrate comprising a circuit which is electrically connected to an input terminal of said light emitting device through a second signal connecting wire, for applying an electric signal to the input terminal;
- a second mounting substrate for mounting said second substrate, electrically connected to said first mounting substrate;
- a first conductive wire placed nearby a connection part between said first optical connector and said first substrate without contacting said first signal connecting wire; and a second conductive wire placed nearby a connection part between said second optical connector and said second substrate without contacting said second signal connecting wire;

said first mounting substrate comprising a first reference potential region being of a part of the first mounting substrate and projecting outside from a part where said first substrate is mounted;

said first substrate comprising a second reference potential region on a surface of said first substrate, which region is electrically connected to said first mounting substrate;

one end of said first conductive wire being connected to one of said first reference potential region and said second reference potential region, and the other end of said first conductive wire being connected to one of said first reference potential region and said second reference potential region;

said second mounting substrate comprising a third reference potential region being of a part of the second mounting substrate and projecting outside from a part where said second substrate is mounted;

said second substrate comprising a fourth reference potential region on a surface of said second substrate, which region is electrically connected to said second mounting substrate; and one end of said second conductive wire being connected to one of said third reference potential region and said fourth reference potential region, and the other end of said second conductive wire being connected to one of said third reference potential region and said fourth reference potential region.

35. An optical module according to claim 34, wherein said first conductive wire is placed at a plurality of places so that a region where said first signal connecting wire is placed is surrounded; and said second conductive wire is placed at both sides bordering said second signal connecting wire, and one end of each said second conductive wire is connected to said third reference potential region, and the other end of each said second conductive wire is connected to said fourth reference potential region.

36. An optical module according to claim 35, wherein said first conductive wire is a bonding wire.

37. An optical module according to claim 35, wherein said second conductive wire is a bonding wire.

38. An optical module according to claim 35, wherein said first conductive wire is a flat ribbon-shaped wire.

39. An optical module according to claim 35, wherein said second conductive wire is a flat ribbon-shaped wire.

40. An optical module according to claim 35, wherein said first and second mounting substrates are a part of a lead frame.

41. An optical module according to claim 35, wherein the potential applied to said first to fourth reference potential regions is a ground potential.

* * * * *